(12) United States Patent
Lim et al.

(10) Patent No.: US 10,818,985 B2
(45) Date of Patent: *Oct. 27, 2020

(54) HEAT EXCHANGER FOR COOLING ELECTRICAL ELEMENT

(71) Applicant: Hanon Systems, Daejeon (KR)

(72) Inventors: Hong-Young Lim, Daejeon (KR); Jun Young Song, Daejeon (KR); Wi Sam Jo, Daejeon (KR); Hyun Hee Jung, Daejeon (KR); Sun Mi Lee, Daejeon (KR)

(73) Assignee: Hanon Systems, Daejeon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/554,732

(22) Filed: Aug. 29, 2019

(65) Prior Publication Data

US 2019/0386355 A1    Dec. 19, 2019

Related U.S. Application Data

(63) Continuation of application No. 15/521,641, filed as application No. PCT/KR2016/001159 on Feb. 3, 2016, now Pat. No. 10,448,545.

(30) Foreign Application Priority Data

Mar. 10, 2015 (KR) ........................ 10-2015-0033118
Mar. 10, 2015 (KR) ........................ 10-2015-0033201
Mar. 17, 2015 (KR) ........................ 10-2015-0036562

(51) Int. Cl.
*H02K 7/20*     (2006.01)
*H01L 23/473*   (2006.01)
(Continued)

(52) U.S. Cl.
CPC .......... *H01M 10/60* (2015.04); *F28D 1/0476* (2013.01); *H01M 8/04029* (2013.01);
(Continued)

(58) Field of Classification Search
CPC ........... H05K 7/20927; H05K 7/20218; H05K 7/1432; H05K 7/20254; H01L 23/473;
(Continued)

(56) References Cited

U.S. PATENT DOCUMENTS 7,656,016 B2    2/2010  Yoshimatsu et al.
9,907,216 B2    2/2018  Park
(Continued)

FOREIGN PATENT DOCUMENTS

JP    2002-009216 A    1/2002
JP    2008271770 A     11/2008
(Continued)

*Primary Examiner* — Zachary Pape
(74) *Attorney, Agent, or Firm* — Norton Rose Fulbright US LLP; James R. Crawford

(57) ABSTRACT

The present invention relates to a heat exchanger for cooling an electrical element and a heat exchanger assembly for cooling an electrical element, and more particularly, to a heat exchanger for cooling an electrical element and a heat exchanger assembly for cooling an electrical element into which the electrical element may be easily inserted and in which both surfaces of the electrical element and a tube through which a coolant flows are formed to contact each other to improve cooling performance.

10 Claims, 13 Drawing Sheets

(51) Int. Cl.
*H05K 7/14* (2006.01)
*H01M 8/04029* (2016.01)
*F28D 1/047* (2006.01)
*H01M 10/60* (2014.01)
*H05K 7/20* (2006.01)
*H01M 10/613* (2014.01)
*H01M 10/625* (2014.01)
*H01M 10/6556* (2014.01)
*H01M 10/6568* (2014.01)

(52) U.S. Cl.
CPC ....... *H01M 10/613* (2015.04); *H01M 10/625* (2015.04); *H01M 10/6556* (2015.04); *H01M 10/6568* (2015.04); *H05K 7/20254* (2013.01); *H05K 7/20927* (2013.01); *H01L 23/473* (2013.01); *H01M 2250/20* (2013.01); *H05K 7/1432* (2013.01); *H05K 7/20218* (2013.01); *Y02T 90/40* (2013.01)

(58) Field of Classification Search
CPC ... H01H 9/52; F28D 9/00–904; F28D 9/0043; F28D 1/0476; F28F 9/0246; H01M 10/613
USPC ........................ 361/679.46–679.54, 688–723; 257/712–722
See application file for complete search history.

(56) References Cited

U.S. PATENT DOCUMENTS

| | | | |
|---|---|---|---|
| 2001/0033477 | A1 | 10/2001 | Inoue et al. |
| 2016/0126160 | A1* | 5/2016 | Jeong .................... H01L 23/473 |
| | | | 361/699 |
| 2017/0365890 | A1 | 12/2017 | Lim et al. |
| 2018/0352686 | A1 | 12/2018 | Song et al. |

FOREIGN PATENT DOCUMENTS

| | | | |
|---|---|---|---|
| JP | 4542552 | B2 | 9/2010 |
| KR | 20040105439 | A | 12/2004 |
| KR | 100471593 | B1 | 3/2005 |
| KR | 101380078 | B1 | 4/2014 |

\* cited by examiner

HEAT EXCHANGER FOR COOLING ELECTRICAL ELEMENT

This application is a continuation of U.S. patent application Ser. No. 15/521,641 filed Apr. 25, 2017, allowed, which is a § 371 of International Application No. PCT/KR2016/001159 filed Feb. 3, 2016, and claims priority from Korean Patent Application Nos. 10-2015-0033118 filed Mar. 10, 2015, 10-2015-0033201 filed Mar. 10, 2015 and 10-2015-0036562 filed Mar. 17, 2015.

TECHNICAL FIELD

The present invention relates to a heat exchanger for cooling an electrical element and a heat exchanger assembly for cooling an electrical element, and more particularly, to a heat exchanger for cooling an electrical element and a heat exchanger assembly for cooling an electrical element into which the electrical element may be easily inserted and in which both surfaces of the electrical element and a tube through which a coolant flows are formed to contact each other to improve cooling performance.

BACKGROUND ART

Recently, the development of a hybrid vehicle, a fuel cell vehicle, and an electric vehicle, or the like, using driving force of a motor as a part of measures against an environmental problem has been increasingly spotlighted. The vehicle as described above is generally mounted with a power control unit (PCU) controlling electricity supplied from a driving battery (for example, a voltage of 300V) to be supplied in a desired state to a motor.

The ECU includes electrical elements such as an inverter, a smoothing condenser, a converter, and the like. Since the electrical elements generate heat while receiving electricity, a separate cooling means is necessarily required.

As the related art, Japanese Patent Laid-Open Publication No. 2001-245478 (published on 7 Sep. 2001 and entitled "Cooling Apparatus of Inverter") has disclosed an inverter in which a semiconductor module having a semiconductor element such as an insulated gate bipolar transistor (IGBT), or the Like, embedded therein is used, and Japanese Patent Laid-Open Publication No. 2008-294283 (published on 4 Dec. 2008 and entitled "Semiconductor Apparatus") has disclosed a heat sink installed to contact a lower surface of a semiconductor element and formed to perform heat exchange a fluid flowing therein.

This singled-sided cooling scheme has a limitation in cooling performance, and a double-sided cooling scheme has been devised in order to improve this problem. Since the double-sided cooling scheme is a structure in which an electrical element is inserted into a space between heat exchangers, it is preferable that conditions in which an electrical element insertion interval of the heat exchanger should be higher than a height of the electrical element and the electrical element and the heat exchanger should be compressed well in order to increase heat transfer performance of the heat exchanger are satisfied.

A heat exchanger in a double-sided cooling scheme as illustrated in FIG. 1 may be configured to include a tube 20 positioned on both surfaces of an electrical element 10 and formed to have a heat exchange medium flowing therein and tanks 30 coupled to both ends of the tube and having the heat exchange medium introduced thereinto or discharged therefrom. However, in the heat exchanger, since the electrical element should be inserted after an insertion space of the electrical element is fixed by brazing-coupling, a process of inserting the electrical element is difficult.

In addition, in the heat exchanger, when an interval between facing surfaces of the tube is widened in order to facilitate insertion of the electrical element, the electrical element and the tube are not compressed, such that heat exchange efficiency is decreased.

Therefore, there is a need to develop a heat exchanger for cooling an electrical element in which insertion of the electrical element is easy and the electrical element and the heat exchanger may be compressed well.

In addition, a module for stably mounting the heat exchanger for cooling an electrical element as described above in a power control unit (PCU) or a hybrid power control unit (HPCU) of a vehicle is required.

DISCLOSURE

Technical Problem

An object of the present invention is to provide a heat exchanger for cooling an electrical element into which the electrical element may be easily inserted, with which the electrical element may be easily compressed, and is which both surfaces of the electrical element and a tube through which a coolant flows may easily contact each other to improve cooling performance and an assembly property, by including the tube having a partial region bent so as to contact both surfaces of the electrical element in a height direction.

Another object of the present invention is to provide an electrical element cooling module capable of efficiently cooling as electrical element and being modularized to be simply mounted in a vehicle, by including upper and lower plates applying a pressure to a bent tube in a height direction so as to maintain a predetermined pressure in the bent tube to allow the bent tube and an element inserted between facing surfaces of the bent tube to closely adhere to each other and as external housing accommodating the upper and lower plates and a heat exchanger for cooling an electrical element therein.

Technical Solution

In one general aspect, a heat exchanger 1 for cooling an electrical element 2 includes: a tube 100 extended in a length direction, bent at a predetermined point so as to contact both surfaces, a height direction, of the electrical element 2 disposed in a partial region of an upper surface thereof, and having a heat exchange medium flowing therein; a first header tank 210 coupled and fixed to one end portion of the tube 100 in the length direction; a second header tank 220 coupled and fixed to the other end portion of the tube 100 in the length direction and disposed to be spaced apart from a center of the first header tank by a predetermined distance in the length direction in a state in which the tube is bent; an inlet pipe 310 formed in the first header tank 210 and having the heat exchange medium introduced therethrough; and an outlet pipe 320 formed in the second head tank 220 and having the heat exchange medium discharged therethrough.

The inlet pipe 310 and the outlet pipe 320 may be disposed to be asymmetric to each other on the basis of a central line of the first header tank 210 in a width direction.

One end surfaces of the inlet pipe 310 and the outlet pipe 320 connected to the first header tank 210 and the second header tank 220 may have a diameter W1 in horizontal direction thereof larger than a diameter W2 in a vertical direction thereof, and the other end surfaces of the inlet pipe 310 and the outlet pipe 320 may be formed in a circular shape having diameters larger than heights of the first header tank 210 and the second header tank 220.

The tube 100 of which both ends are coupled to the first header tank 210 and the second header tank 220 may be coupled to the first header tank 210 and the second header tank 220 in a state in which it is eccentric from the centers of the first header tank 210 and the second header tank 220 in the height direction.

The tube 100 may include a round part 110 protruding outwardly at the point at which the tube 100 is bent so that a height of the point at which the tube 100 is bent is higher than an interval between facing surfaces of the tube 100 at a point at which the electrical element 2 is seated.

A plurality of tubes 100 may be formed to be spaced apart from each other by a predetermined distance in a width direction.

The tube 100 may include: a first tube 101 extended in the length direction and bent at a predetermined point to closely adhere to both surfaces of the electrical element disposed between surfaces facing each other in the height direction; and a second tube 102 disposed in parallel with the first tube in a state in which it is spaced apart from the first tube by a predetermined distance in the width direction and bent to have an element insertion interval corresponding to a distance between surfaces contacting both surfaces of the electrical element, different from that of the first tube.

In another general aspect, a heat exchanger assembly for cooling an electrical element includes: the heat exchanger 1 for cooling an electrical element as described above; and the electrical element 2, wherein the electrical element 2 is assembled so that both surfaces thereof in the height direction contact the tube 100.

In the case in which the number of tubes 100 is two, element fixing parts 21 of the electrical elements 2 may be disposed in an internal space formed by neighboring tubes 100 spaced apart from each other, and power supply parts 22 of the electrical elements 2 may be disposed in an external space.

The heat exchanger assembly for cooling an electrical element may further include a gap formed by the neighboring tubes 100 spaced apart from each other by a predetermined distance in a width direction, wherein the gap is formed to be at least two times or more longer than a length of the element fixing part 21 protruding at one side of the electrical element 2 in the width direction.

A width Tw of the tube 100 may be smaller than or equal to a width Cw of the electrical element 2.

In the case in which a plurality of tubes 100 are formed to be spaced apart from each other by a predetermined distance in a width direction, heights of the electrical elements 2 inserted in the respective tubes 100 may be different from each other.

An electrical element cooling module 10 includes: the heat exchanger 1 for cooling an electrical element as described above; a lower plate 30 disposed on a lower surface of the heat exchanger 1 for cooling an electrical element; an upper plate 40 disposed on an upper surface of the heat exchanger 1 for cooling an electrical element and coupled to the lower plate 30 to apply a predetermined pressure to the heat exchanger 1 for cooling an electrical element; and an external housing 50 in which the heat exchanger 1 for cooling an electrical element, the lower plate 30, and the upper plate 40 are accommodated.

The electrical element cooling module may further include an elastic member 60 disposed in a space between the upper plate 40 and the tube 100 and having elasticity in the height direction.

The elastic member 60 may be extended in the length direction so as to correspond to the tube 100, and be bent from both end portions in a zigzag form so that both sides thereof are symmetrical to each other on the basis of central line in a width direction.

The electrical element cooling module 10 may be in communication with the outside of the external housing 50 through the inlet pipe 310 and the outlet pipe 320, and a first coupling hole 51 and a second coupling hole 52 into which the inlet pipe 310 and the outlet pipe 320 are inserted to protrude outwardly may be formed in the external housing 50.

The electrical element cooling module may further include sealing members 53 mounted between the inlet pipe 310 and the first coupling hole 51 and between the outlet pipe 320 and the second coupling hole 52.

The electrical element cooling module may further include a fixing bracket 400 connecting the heat exchanger for cooling an electrical element and the external housing 50 to each other.

The fixing bracket 400 may be coupled to one or more of the first header tank 210, the second header tank 220, the tube 100, the inlet pipe 310, and the outlet pipe 320.

In the case in which the number of tubes 100 of the heat exchanger 1 for cooling an electrical element is two, element fixing parts 21 of the electrical elements 2 may be disposed in an internal space formed by neighboring tubes 100 spaced apart from each other in a width direction, and power supply parts 22 of the electrical elements 2 may be disposed in an external space.

Two upper plates 40 may be disposed at positions corresponding to the tubes 100, and element coupling parts 42 coupled to the element fixing parts 21 may be formed at sides of the upper plates 40 neighboring to each other.

The upper plates 40 may include second plate coupling parts 41 formed at positions corresponding to first plate coupling parts 31 formed at both sides of the lower plate in a width direction and coupled to the first plate coupling parts 31.

Advantageous Effects

In the heat exchanger for cooling an electrical element according to the present invention, both surfaces of the electrical element and the tube through which a coolant flows may contact each other, thereby making it possible to effectively cool heat generated in an integrated circuit element.

In addition, the heat exchanger for cooling an electrical element according to the present invention includes the tube having a partial region bent so as to contact both surfaces of the electrical element in the height direction, such that the electrical element may be easily inserted into the heat exchanger for cooling an electrical element and the electrical element may be easily compressed with the heat exchanger for cooling an electrical element, thereby making it possible to improve cooling performance and an assembly property.

In other words, in order to solve a problem that it is difficult to compress the electrical element and the tube when an interval between the facing surfaces of the tube is increased so that the electrical element may be easily inserted and it is difficult to insert the electrical element when the interval between the facing surfaces of the tube is decreased in order to compress the electrical element and the tube in a heat exchanger in an existing double-sided cooling scheme, in the present invention, the electrical element is disposed in a space between the facing surfaces of the tube bent at a predetermined angle without performing a process of inserting the electrical element into a narrow gap, and the tube and the electrical element are compressed together with each other, thereby making it possible to improve cooling performance and an assembly property.

In this case, in the present invention, the first header tank and the second header tank are not disposed on the same line in the height, direction in a state in which the tube is bent, such that even though a height of the electrical element is low, the tube may compress the electrical element.

In addition, in the present invention, the tube includes the round part protruding outwardly at the point at which the tube is bent, thereby making it possible to prevent damage to the tube in a process of bending the tube so as to contact both surfaces of a thin electrical element having a thickness of about 4 to 5 mm.

Further, in the present invention, the inlet and outlet pipes may be configured in the same direction, such that a configuration of a channel becomes simple, and a space occupied by the inlet and outlet pipes in a vehicle may be decreased, thereby making it possible to allow peripheral components to be easily disposed.

Further, in the heat exchanger for cooling an electrical element according to the present invention, a plurality of tubes are disposed, and the plurality of tubes are bent at different heights when they are bent, such that two kinds or more of electrical elements having different heights may be used in the heat exchanger for cooling an electrical element.

In addition, as described above, the electrical element cooling module according to the present invention includes upper and lower plates applying a pressure to a bent tube in a height direction so as to maintain a predetermined pressure in the bent tube to allow the bent tube and an element inserted between facing surfaces of the bent tube to closely adhere to each other and an external housing accommodating the upper and lower plates and a heat exchanger for cooling an electrical element therein, thereby making it possible to efficiently cool an electrical element and be modularized to be simply mounted in a vehicle.

In this case, in the present invention, even though thermal expansion of the heat exchanger for cooling an electrical element and the electrical element is generated, a constant pressure may be always maintained due to the elastic member provided between the tube and the upper plate.

Further, in the present invention, at the time of assembling the element to the tube, the element fixing part is positioned between the facing surfaces of the tube, and the power supply part of the element is positioned outside the tube to facilitate connection of the power supply part at the time of assembling the entire module.

BEST MODE

Figure 1:
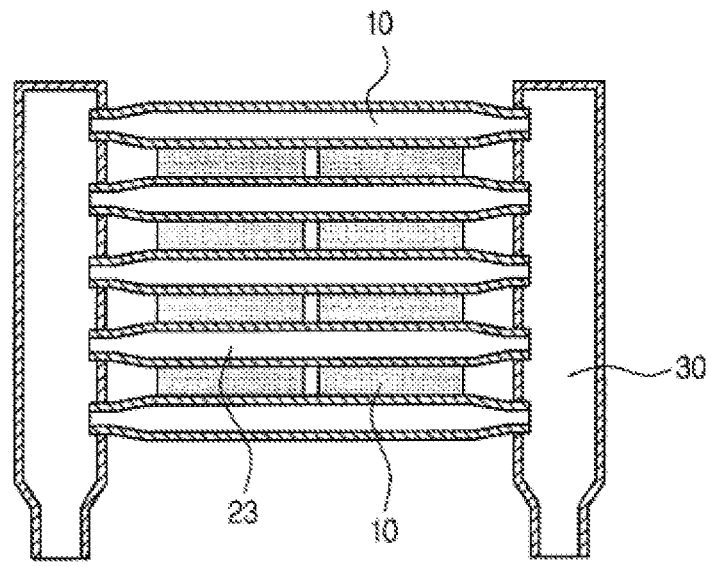
FIG. 1 is a side view illustrating an example of an apparatus for cooling an electrical element according to the related art.

Hereinafter, a heat exchanger for cooling an electrical element and a heat exchanger assembly for cooling an electrical element according to the present invention will be described in detail with reference to the accompanying drawings.

The present invention relates to a heat exchanger 1 for cooling an electrical element in a double-sided cooling scheme, formed to contact both surfaces of the electrical element. The heat exchanger 1 for cooling an electrical element may be mainly configured to include a tube 100, a first header tank 210, a second header tank 220, an inlet pipe 310, and an outlet pipe 320.

Here, the electrical element may be any one of a vehicle inverter, a motor driving inverter, and an air conditioner inverter in which a semiconductor module having a semiconductor element such as an insulated gate bipolar transistor (IGBT), or the like, and a diode embedded therein is used, and the present invention relates to the heat exchanger 1 for cooling the electrical element.

Figure 2:
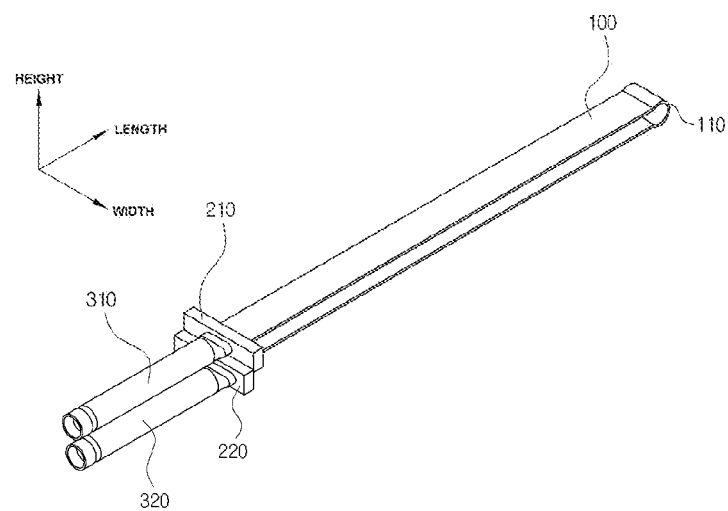
FIG. 2 is a perspective view illustrating a heat exchanger for cooling an electrical element according to the present invention.
Figure 3:
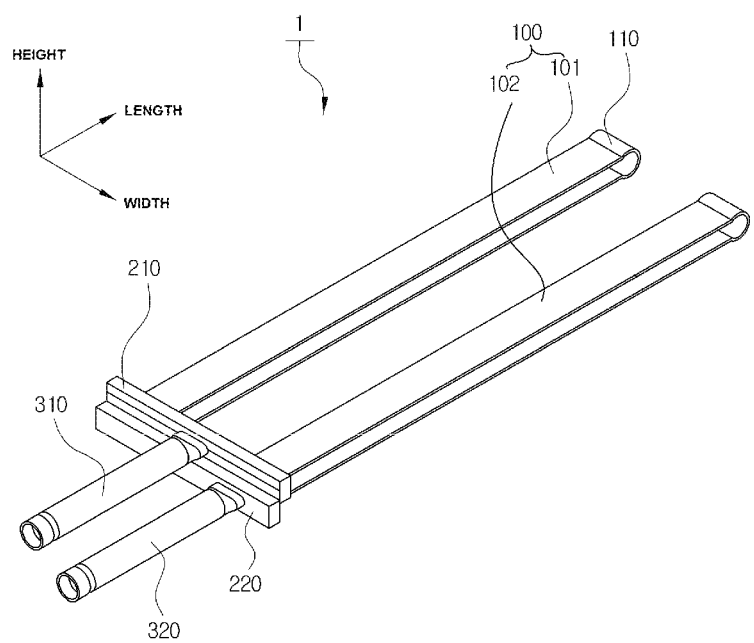
FIG. 3 is a perspective view illustrating another heat exchanger for cooling an electrical element according to the present invention.

The tube 100, which is extended in a length direction and has a heat exchange medium flowing therein, may be formed as illustrated in FIGS. 2 and 3.

The heat exchange medium flowing in the tube 100 may be a natural refrigerant such as water with which an ethylene glycol-based antifreezing solution is mixed, water, ammonia, or the like, a Fron-based refrigerant such as R134a, or the like, an alcohol-based refrigerant, a ketone-based refrigerant such as acetone, or the like.

The tube 100 may be a tube 100 manufactured in a scheme in which a plurality of partition wall are extruded in the length direction therein, a tube 100 manufactured in a bended scheme, or a tube 100 manufactured in a welded scheme.

A description will be provided on the basis of FIG. 3. The first header tank 210 is coupled and fixed to one end portion of the tube 100 in the length direction before the tube 100 is bent, and has the inlet pipe 310 formed therein, such that the heat exchange medium may be introduced into the first header tank 210.

The second header tank 220 is coupled and fixed to the other end portion of the tube 100 in the length direction before the tube 100 is bent, and has the outlet pipe 320 formed therein, such that the heat exchange medium may be discharged from the second header tank 220.

That is, in the heat exchanger 1 for cooling an electrical element according to the present invention, the first header tank 210 and the second header tank 220 are coupled and fixed to both ends of the tube 100 before the tube 100 is bent, such that the first header tank 210 and the second header tank 220 are in a state in which they are spaced apart from each other by a predetermined distance in parallel with each other in the length direction.

Then, as illustrated in FIGS. 2 and 3, in the heat exchanger 1 for cooling an electrical element according to the present invention, the tube 100 is bended on the basis of a predetermined point so that both surfaces, in a height direction, of the electrical element disposed on a partial region of an upper surface of the tube 100 and the tube 100 contact each other.

In the heat exchanger 1 for cooling an electrical element according to the present invention, the tube 100 is bent in a state in which the first header tank 210 and the second header tank 220 are brazed and coupled to both ends of the tube 100, and particularly, the first header tank 210 and the second header tank 220 are not disposed on the same line in the height direction, such that the electrical element may be compressed by the tube 100 even though the electrical element is very thin.

In other words, in the present invention, even though the tube 100 is bent, the first header tank 210 and the second header tank 220 are not stacked in the height direction, but are disposed to be misaligned with each other in the height direction, such that an element insertion interval of the tube 100 may be freely adjusted regardless of the first header tank 210 and the second header tank 220.

In addition, in the heat exchanger 1 for cooling an electrical element according to the present invention, as interval between facing surfaces of the tube 100 coincides with a height of the electrical element in a final shape corresponding to a state in which the tube 100 is completely bent, in order to allow both surfaces of the electrical element and the tube 100 to closely adhere to each other, and as illustrated in FIG. 3, in the case in which the height of the electrical element is very low even in a state in which the first header tank and the second header tank are not disposed on the same line, it is preferable that the tube 100 of which both ends are coupled to the first header tank 210 and the second header tank 220 is coupled to the first header tank 210 and the second header tank 220 in a state in which it is eccentric inwardly from the centers of the first header tank 210 and the second header tank 220 in the height direction.

Meanwhile, the tube 100 may include a first tube 101 extended in the length direction and bent at a predetermined point to closely adhere to both surfaces of the electrical element disposed between surfaces facing each other in the height direction, and a second tube 102 disposed in parallel with the first tube in a state in which it is spaced apart from the first tube by a predetermined distance in a width direction and bent to have an element insertion interval, which is a distance between surfaces contacting both surfaces of the electrical element, different from that of the first tube.

Therefore, in the present invention, even though electrical elements have different heights, after the first tube 101 and the second tube 102 are bent depending on the heights of the electrical elements at the time of being bent, and the electrical elements are appropriately disposed in and inserted into the first tube 101 and the second tube 102, thereby making it possible to perform efficient double-sided cooling.

In this case, thermal resistance of the first tube 101 and the second tube 102 should be decreased in order to improve heat transfer efficiency between the first and second tubes 101 and 102 and the electrical elements. To this end, deformation of the first and second tubes 101 and 102 in the width direction and the length direction should not be present on surfaces of the first and second tubes 101 and 102 contacting the electrical elements and it is preferable that flatness of the first and second tubes 101 and 102 is at most 0.15 or less.

Figure 8:
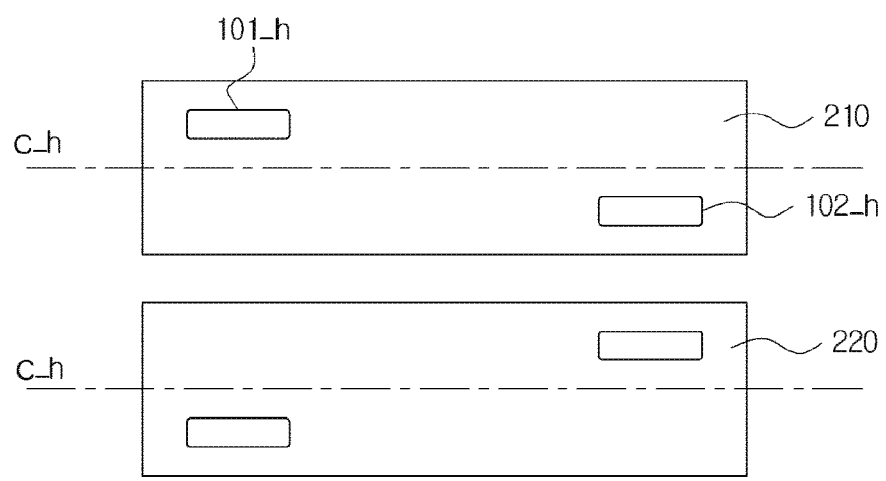
FIG. 8 is a front view of a first header tank and a second header tank in the heat exchanger for cooling an electrical element according to the present invention.

FIG. 8, which illustrates positions of a first tube insertion hole 101_h and a second tube insertion hole 102_h formed in the first header tank and the second header tank in the case in which electrical elements having different heights are inserted into the tubes, illustrates an example in which thick electrical element is disposed in the first tube 101 and a thin electrical element is disposed in the second tube 102.

In the case in which a height of the electrical element is very low as in the electrical element inserted into the second tube 102, the first tube 101 or the second tube 102 may be coupled to the first header tank 210 or the second header tank 220 in a state in which it is eccentric inwardly from the center lines C_h of the first header tank 210 and the second header tank 220 in the height direction. To the contrary, in the case in which the electrical element is thick as in the electrical element inserted into the first tube 101, the first tube 101 or the second tube 102 may be coupled to the first header tank 210 or the second header tank 220 in a state in which it is eccentric outwardly from the center lines C_h of the first header tank 210 and the second header tank 220 in the height direction.

The first tube 101 is bent at a predetermined point so as to contact both surfaces, in the height direction, of the electrical element disposed on a partial region of an upper surface thereof.

Likewise, the second tube 102 is also bent at a predetermined point so as to contact both surfaces, in the height direction, of the electrical element disposed on a partial region of an upper surface thereof, and the second tube 102 is bent so that the element insertion interval thereof, which is the distance between the surfaces contacting both surfaces of the electrical element, is different from that of the first tube 101.

Therefore, in the present invention, even though electrical elements have different heights, after the first tube 101 and the second tube 102 are bent depending on the heights of the electrical elements at the time of being bent, and the electrical elements are appropriately disposed in and inserted into the first tube 101 and the second tube 102, thereby making it possible to perform efficient double-sided cooling.

In this case, thermal resistance of the first tube 101 and the second tube 102 should be decreased in order to improve heat transfer efficiency between the first and second tubes 101 and 102 and the electrical elements. To this end, deformation of the first and second tubes 101 and 102 in the width direction and the length direction should not be present on surfaces of the first and second tubes 101 and 102 contacting the electrical elements and it is preferable that flatness of the first and second tubes 101 and 102 is at most 0.15 or less.

Figure 4:
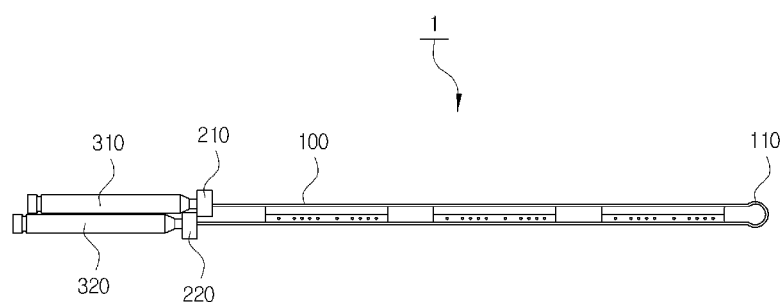
FIG. 4 is a side view illustrating the heat exchanger for cooling an electrical element according to the present invention.
Figure 5:
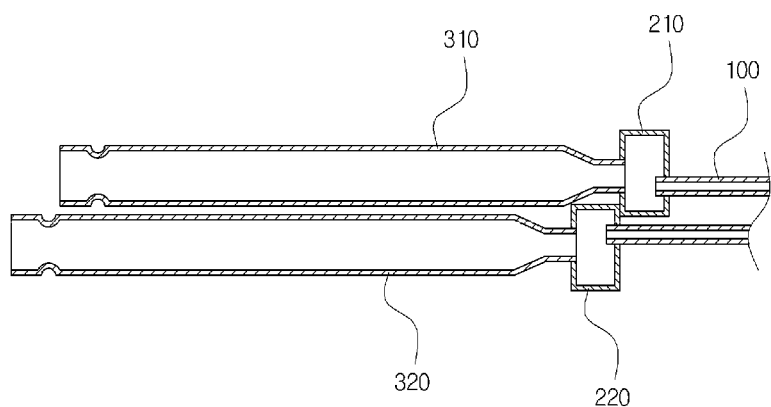
FIG. 5 is a side cross-sectional view illustrating an inlet pipe and an outlet pipe in the heat exchanger for cooling an electrical element of FIG. 3.

FIG. 4, which illustrates positions of a first tube insertion hole 101_h and a second tube insertion hole 102_h formed in the first header tank and the second header tank in the case in which electrical elements having different heights are inserted into the tubes, illustrates an example in which a thick electrical element is disposed in the first tube 101 and a thin electrical element is disposed in the second tube 102.

In the case in which a height of the electrical element is very low as in the electrical element inserted into the second tube 102, the first tube 101 or the second tube 102 may be coupled to the first header tank 210 or the second header tank 220 in a state in which it is eccentric inwardly from the center lines C_h of the first header tank 210 and the second header tank 220 in the height direction. To the contrary, in the case in which the electrical element is thick as in the electrical element inserted into the first tube 101, the first tube 101 or the second tube 102 may be coupled to the first header tank 210 or the second header tank 220 in a state in which it is eccentric outwardly from the center lines C_h of the first header tank 210 and the second header tank 220 in the height direction.

As described above, the heat exchanger 1 for cooling an electrical element according to the present invention has a form in which the electrical element is inserted between facing surfaces of the bent tube 100 when the heat exchanger 1 for cooling an electrical element is assembled to the electrical element, and a distance between the facing surfaces of the tube 100 in a state in which the tube 100 is completely bent is only about 4 to 5 mm in order to allow both surfaces of the electrical element and the tube 100 to closely adhere to each other.

In order for a distance between the facing surfaces of the bent tube 100 to be about 4 to 5 mm, a fatigue degree applied to the point at which the tube 100 is bent cannot but be significant large. Therefore, in order to minimize the fatigue degree, the tube 100 may include a round part 110 protruding outwardly at the point at which the tube 100 is bent so that a height of the point at which the tube 100 is bent may be higher than an interval between the facing surfaces of the tube 100 at a point at which the electrical element as seated.

As illustrated in FIG. 4, the round part 110 is formed at the point in which the tube is bent, and a cross section of the round part 100 may have a circular shape of which a partial region of one side is opened.

In the heat exchanger 1 for cooling an electrical element according to the present invention, diameters of the inlet pipe 310 and the outlet pipe 320 may be larger than heights of the first header tank 210 and the second header tank 220. In this case, when the inlet pipe 310 and the outlet pipe 320 are formed to be disposed at central portions of the first header tank 210 and the second header tank 220, respectively, interference between the inlet pipe 310 and the outlet pipe 320 cannot but be generated when the first header tank 210 and the second header tank 220 are positioned in parallel with each other in the height direction by bending the tube 100.

Therefore, in the heat exchanger 1 for cooling an electrical element according to the present invention, it is preferable that the inlet pipe 310 and the outlet pipe 320 are disposed to be asymmetric to each other on the basis of a central line of the first header tank 210 in the width direction.

In this case, in the heat exchanger 1 for cooling an electrical element according to the present invention, shapes and positions of the inlet pipe 310 and the outlet pipe 320 may be changed in order to appropriately distribute the heat exchange medium. In the case in which two tubes are formed as illustrated in FIG. 3, the inlet pipe 310 may be disposed at the center of the first header tank 210 to allow the introduced heat exchange medium to be uniformly distributed to the two tubes 100.

Figure 6:
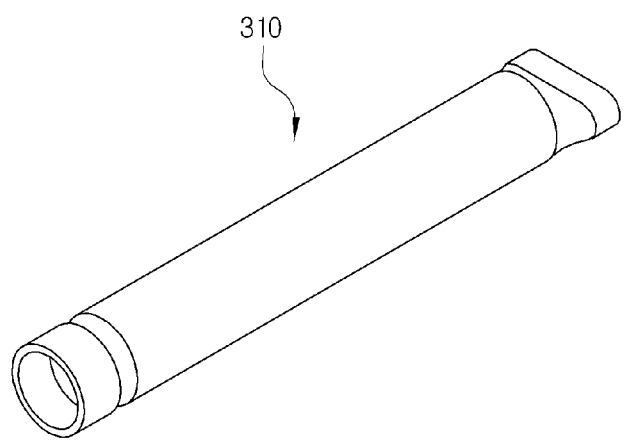
FIG. 6 is a perspective view illustrating an inlet pipe and an outlet pipe according to the present invention.

As described above, in the heat exchanger 1 for cooling an electrical element according to the present invention, the diameters of the inlet pipe 310 and the outlet pipe 320 may be larger than the heights of the first header tank 210 and the second header tank 220. In more detail, as illustrated in FIGS. 6 and 7, cross sections of sides of the inlet pipe 310 and the outlet pipe 320 connected to the first header tank 210 and the second header tank 220 and cross sections of the other sides of the inlet pipe 310 and the outlet pipe 320 are formed to be different from each other, and diameters of the cross sections of the other sides are larger than the heights of the first header tank 210 and the second header tank 220.

In a heat exchanger for cooling an electrical element mounted in a power control unit (PCU) or a hybrid power control unit (HPCU), it is preferable that header tanks are designed as a size as small as possible in order to improve a package. In this case, since an inlet pipe and an outlet pipe of the heat exchanger for cooling an electrical element use a cooling fluid of a vehicle, they have a common diameter, which is generally larger than the size of the header tanks. Therefore, the inlet pipe and the outlet pipe according to the present invention have a diameter larger in the other end portions thereof than in one end portions thereof connected to the first header tank 210 and the second header tank 220.

Figure 7A:
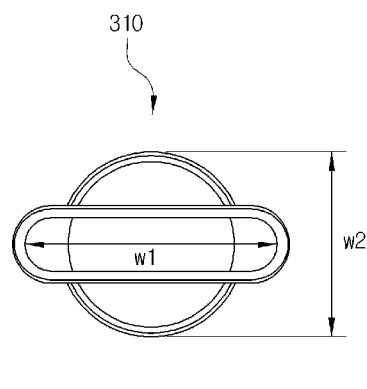
FIGS. 7A and 7B are front views of the inlet pipe in the heat exchanger for cooling an electrical element of FIG. 3, when viewed from a rear end and a front end, respectively.
Figure 7B:
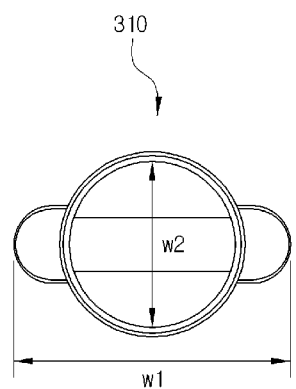

Referring to FIG. 7, front ends of the inlet pipe and the outlet pipe are formed in a circular pipe shape having a common diameter, and rear ends of the inlet pipe and the outlet pipe are formed so that a diameter W1 thereof in a horizontal direction is larger than a diameter W2 thereof in a vertical direction, such that the inlet pipe and the outlet pipe are connected to the first header tank 210 and the second header tank 220 formed so as to be smaller than the common diameter of the front ends.

Figure 9:
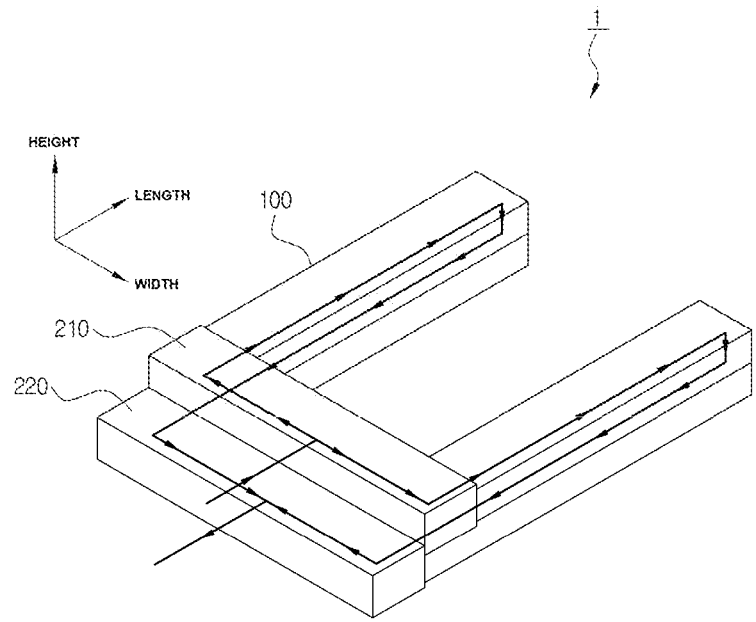
FIG. 9 is a view illustrating a flow of a heat exchange medium or the heat exchanger for cooling an electrical element illustrated in FIG. 3.

A flow of the heat exchange medium in the heat exchanger for cooling an electrical element according to the present invention will be described with reference to FIG. 9.

First, the heat exchange medium introduced through the inlet pipe 310 that is in communication with the first header tank 210 passes through the first header tank 210, and then flows along the tube 100 closely adhering to an upper surface of the electrical element.

Next, the heat exchange medium flows along the tube 100 closely adhering to a lower surface of the electrical element 2, passes through the second header tank 220, and is then discharged to the outlet pipe 320.

Figure 10:
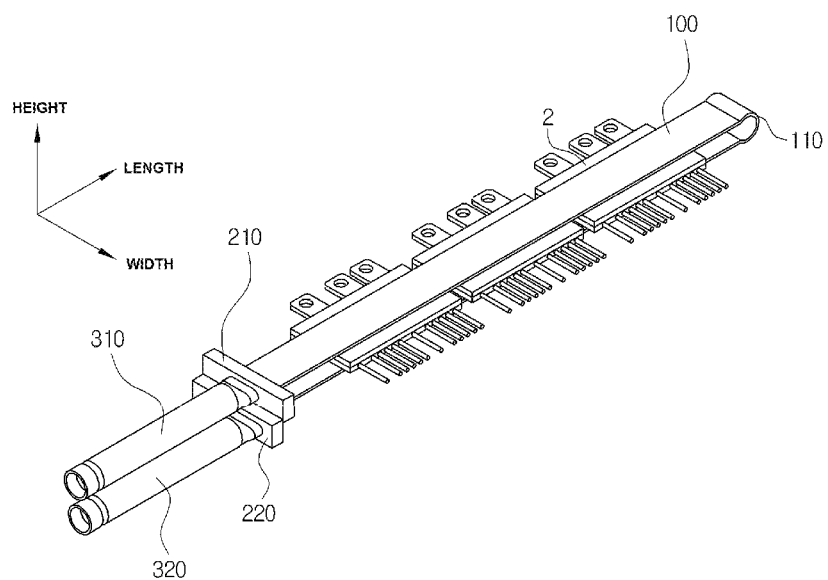
FIG. 10 is a perspective view illustrating a heat exchanger assembly for cooling an electrical element according to the present invention.
Figure 11:
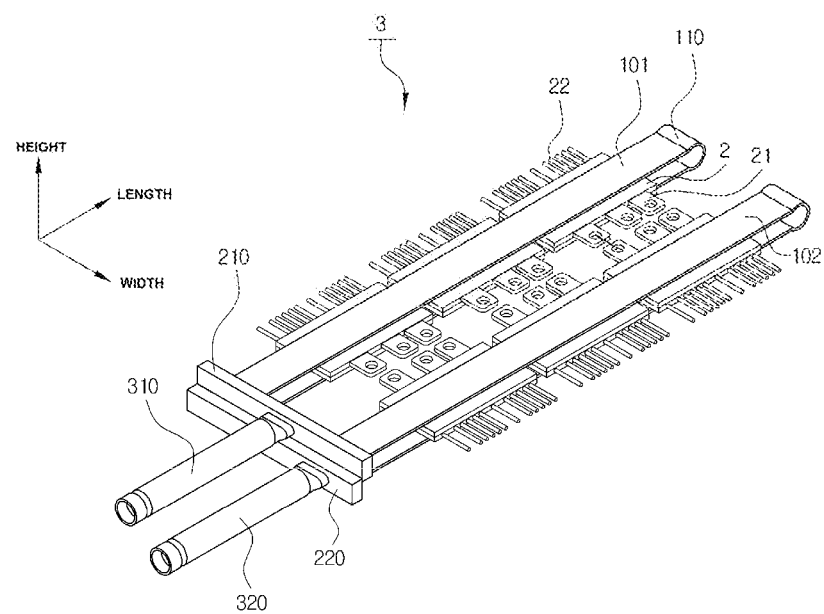
FIG. 11 is a perspective view illustrating another heat exchanger assembly for cooling an electrical element according to the present invention.
Figure 12:
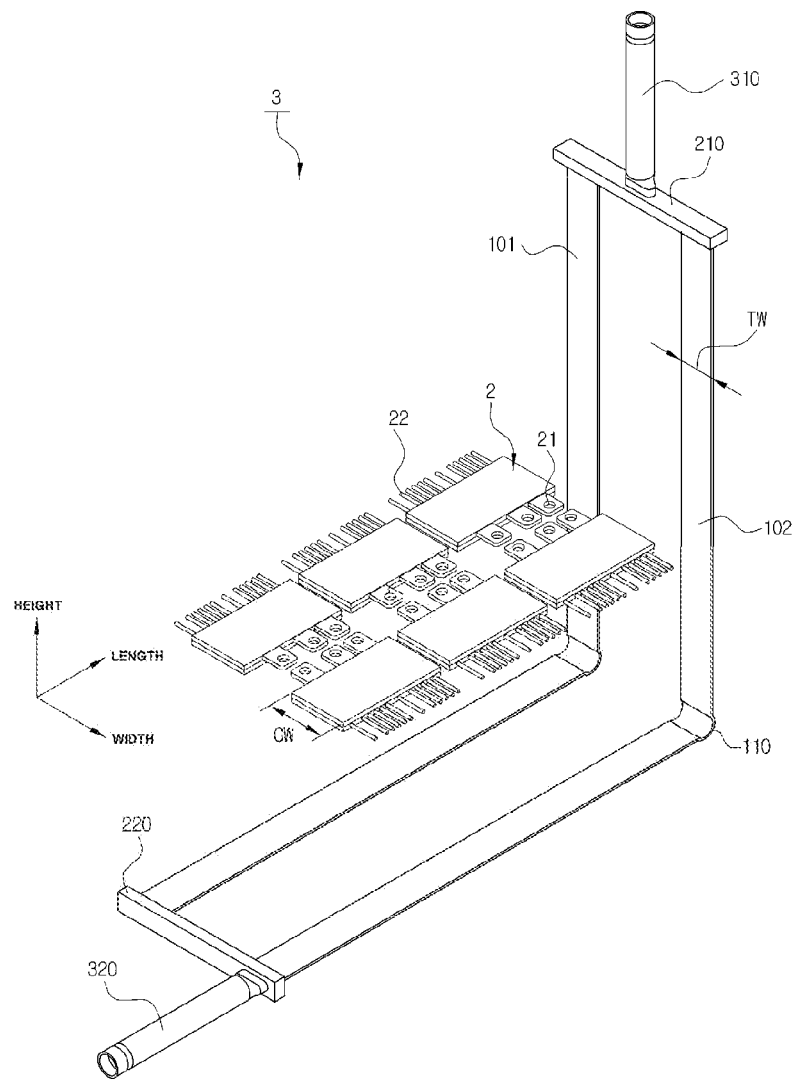
FIG. 12 is an exploded perspective view illustrating the heat exchanger assembly for cooling an electrical element of FIG. 11.

Meanwhile, as illustrated in FIGS. 10 to 12, a heat exchanger assembly 3 for cooling an electrical element according to the present invention is formed by assembling the tube 100 of the heat exchanger 1 for cooling an electrical element as described above and both surfaces of the electrical elements in the height direction so as to closely adhere to each other.

In the heat exchanger assembly 3 for cooling an electrical element according to the present invention, in the case in which the number of tubes 100 is one, connectors 22 of the electrical elements 2 are disposed at one side of the tube 100 in the width direction, and element fixing parts 21 of the electrical elements 2 are disposed at the other side of the tube 100 in the width direction.

In addition, in the heat exchanger assembly 3 for cooling an electrical element according to the present invention, in the case in which the number of tubes 100 is two, it is preferable that the element fixing parts 21 of the electrical elements are disposed in an internal space formed by neighboring tubes 100 spaced apart from each other and the connectors 22 of the electrical elements are disposed in external spaces to facilitate connection of power supply parts at the time of assembling an entire module.

In this case, the heat exchanger 1 for cooling an electrical element according to the present invention includes a gap formed by the tubes 100 spaced apart from each other by a predetermined distance in the width direction, and it is preferable that the gap is formed to be at least two times or more longer than a length of the element fixing part 21 protruding at one side of the electrical element in the width direction to prevent generation of interference between the element fixing parts 21 of the electrical elements 2 disposed to neighbor to each other.

In addition, in the heat exchanger 1 for cooling an electrical element according to the present invention, it is preferable that a width Tw of the tube 100 is smaller than or equal to a width Cw of the electrical element so that the tube 100 does not cover fins protruding at both surfaces of the electrical element in the width direction.

In addition, in the case in which the number of heat exchanger assemblies for cooling an electrical element is two, the first tube 101 and the second tube 102 are bent so that element insertion heights thereof are different from each other, such that an electrical element assembled to the first tube 101 and an electrical element assembled to the second tube 102 may have different heights.

Figure 13:
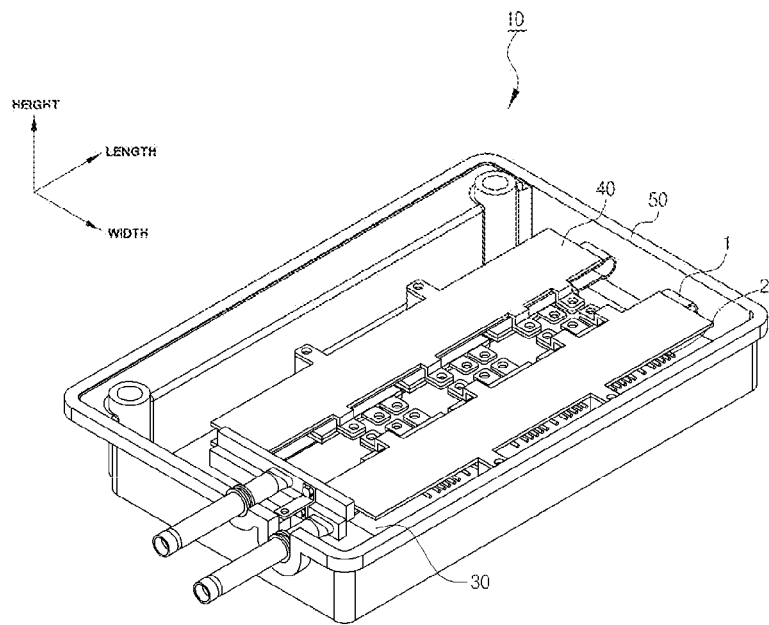
FIG. 13 is a perspective view illustrating an electrical element cooling module according to the present invention.
Figure 14:
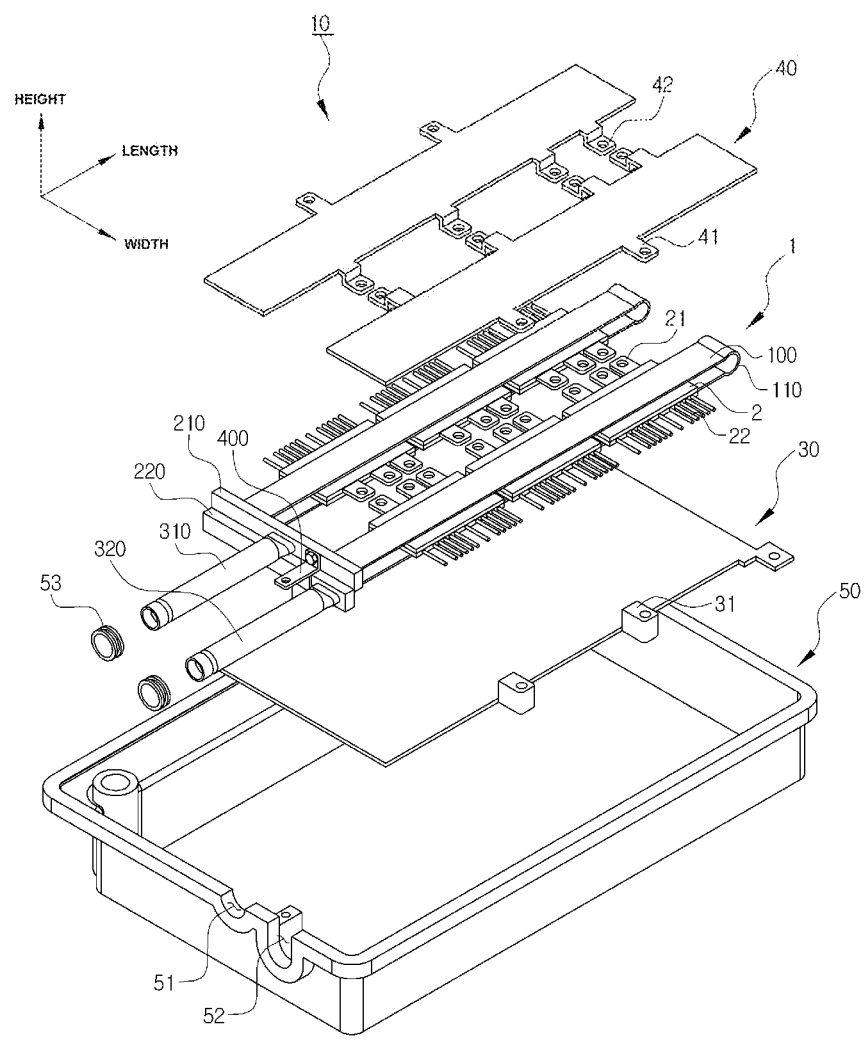
FIG. 14 is an exploded perspective view illustrating the electrical element cooling module according to the present invention.
Figure 15:
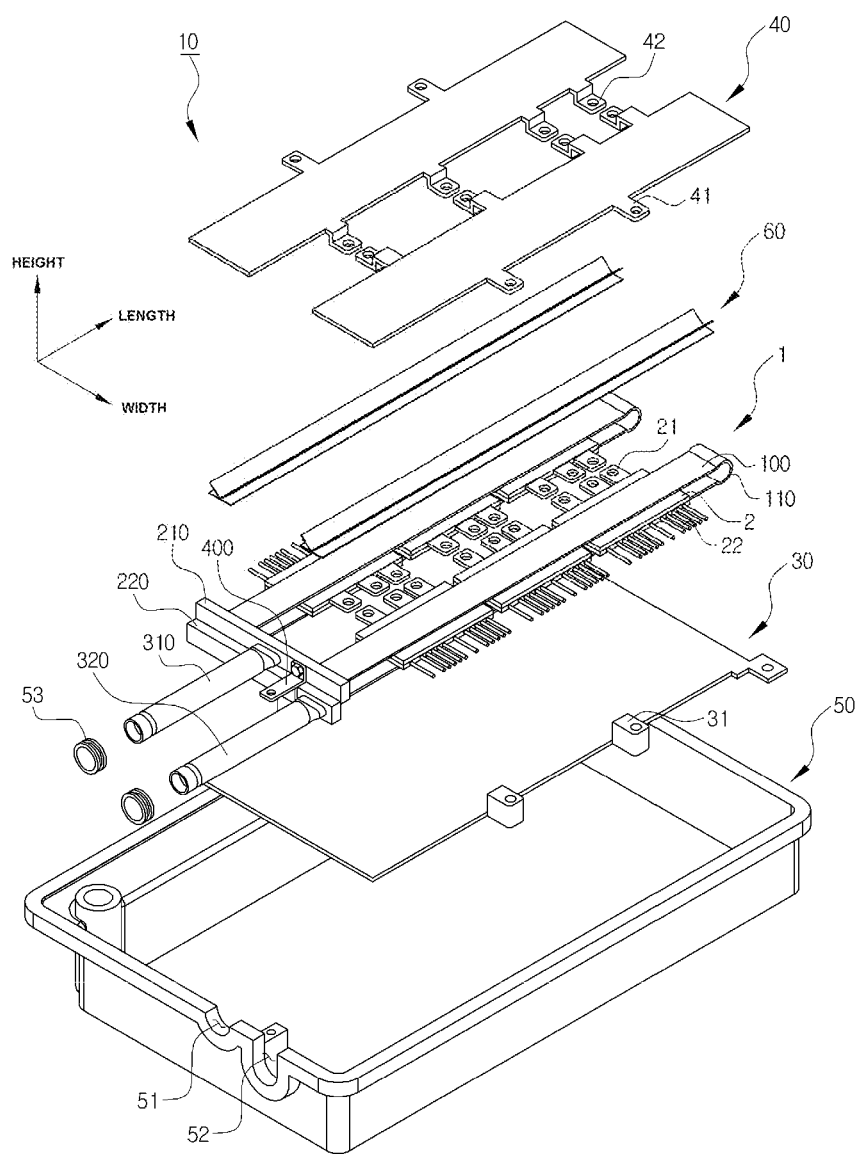
FIG. 15 is an exploded perspective view illustrating another electrical element cooling module according to the present invention.
Figure 16:
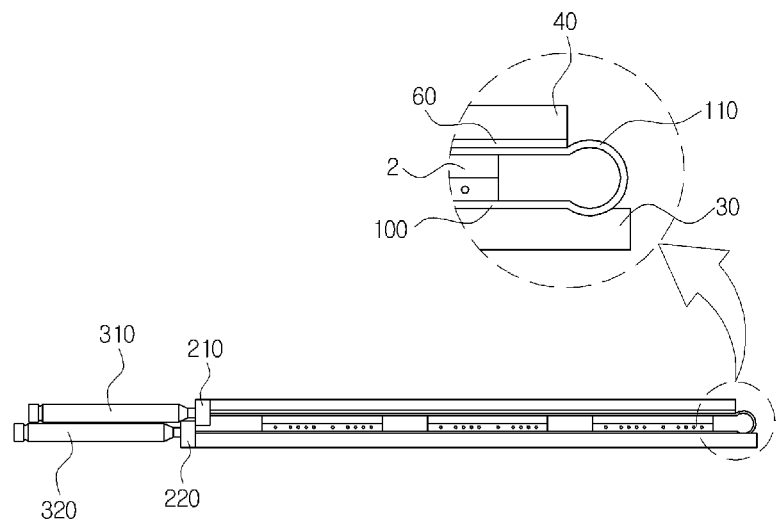
FIG. 16 is a side view illustrating the electrical element cooling module of FIG. 15.
Figure 17:
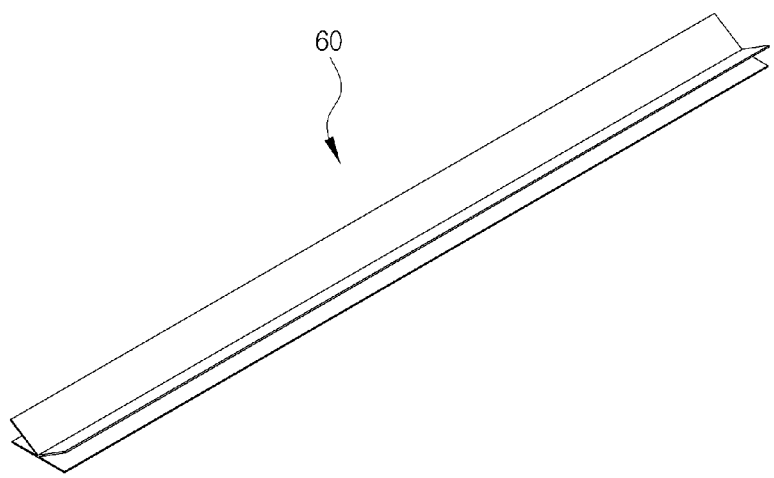
FIG. 17 is a perspective view illustrating an elastic member in FIG. 15.
Figure 18:
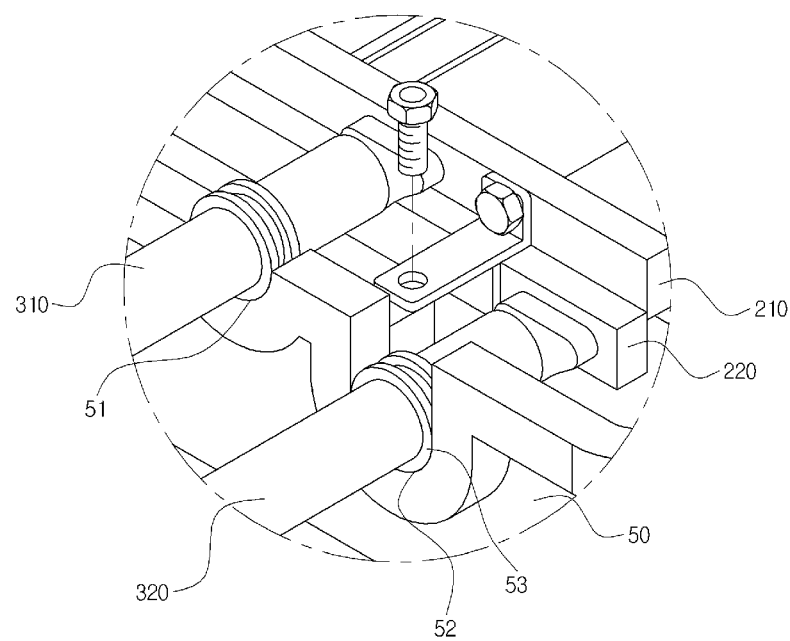
FIG. 18 is a perspective view illustrating an example in which a fixing bracket is mounted at a first header tank and a second header tank in the electrical element cooling module according to the present invention.

Meanwhile, an electrical element cooling module 10 according to the present invention illustrated in FIGS. 13 to 15, which includes the heat exchanger 1 for cooling an electrical element as described above, is a module assembled together with an upper plate 40, a lower plate 30, and an external housing 50.

The lower plate 30 is disposed on a lower surface of the heat exchanger 1 for cooling an electrical element, the upper plate 40 is disposed on an upper surface of the heat exchanger 1 for cooling an electrical element, and the upper plate 40 and the lower plate 30 are coupled to each other to apply a predetermined pressure to the heat exchanger 1 for cooling an electrical element positioned therebetween, thereby making it possible to allow the bent tube 100 and the electrical elements 2 inserted between the facing surfaces of the tube 100 to stably closely adhere to each other.

The external housing 50 accommodates the components as described above therein, and although only a lower housing is illustrated in FIG. 13, an upper housing is actually further provided, and the upper and lower housings are coupled to each other, thereby making it possible to form a closed space in which the heat exchanger 1 for cooling an electrical element and the upper and lower plates 30 and 40 are accommodated.

As illustrated in FIG. 15, the electrical element cooling module 10 may further include an elastic member disposed in a space between the upper plate 40 and the tube 100 and having elasticity in the height direction.

As illustrated in FIG. 15, the elastic member is extended in the length direction so as to correspond to the tube 100, and is bent from both end portions in a zigzag form so that both sides thereof are symmetrical to each other on the basis of a central line in the width direction.

In the heat exchanger 1 for cooling an electrical element, in the case in which the number of tubes 100 is two, the number of elastic member is two so as to correspond to the number of tubes 100, and the elastic members may be lengthily formed to correspond to lengths of the tubes 100.

In this case, one elastic member may be lengthily formed to correspond to the length of the tube 100, as illustrated in FIG. 15, or a plurality of elastic members shorter than the tube 100 may be disposed on the upper surface of the tube 100.

Therefore, in the present invention, even though thermal expansion of the heat exchanger 1 for cooling an electrical element and the electrical element 2 is generated, a constant pressure may be always maintained due to the elastic member provided between the tube 100 and the upper plate 40.

As described above, the external housing 50 accommodates the heat exchanger 1 for cooling an electrical element in an internal space thereof, and is in communication with the outside through the inlet pipe 310 and the outlet pipe 320.

To this end, a first coupling hole 51 and a second coupling hole 52 into which the inlet pipe 310 and the outlet pipe 320 are inserted to protrude outwardly are formed in the external housing 50, and sealing members 53 having a ring shape are further mounted between the inlet pipe 310 and the first coupling hole 51 and between the outlet pipe 320 and the second coupling hole 52, thereby making it possible to allow sealing and fixing between the external housing 50 and the inlet and outlet pipes 310 and 320 to be maintained.

In addition, the electrical element cooling module 10 according to the present invention may include a fixing bracket 400 connecting the heat exchanger for cooling an electrical element and the external housing 50 to each other.

Figure 19:
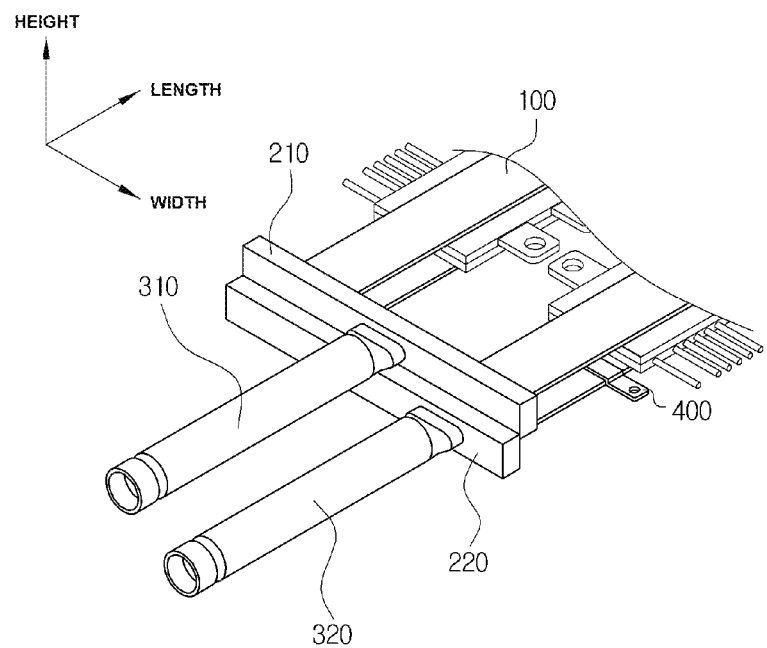
FIGS. 19 and 20 are perspective views illustrating various examples in which the fixing bracket is coupled in the electrical element cooling module according to the present invention.
Figure 20:
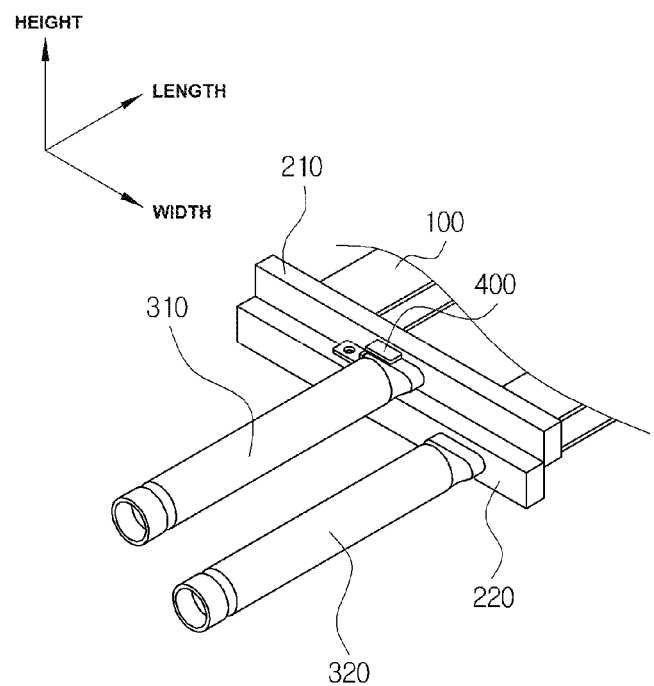

The fixing bracket 400 may be connected to the first header tank 210 and the second header tank 200, as illustrated in FIG. 14, be connected to the tube 100, as illustrated in FIG. 19, or be connected to the inlet pipe 310 or the outlet pipe 320, as illustrated in FIG. 20.

The fixing bracket 400 illustrated in FIG. 14 has a total of three coupling surfaces by coupling an approximately ']' bracket and an approximately '[' bracket to each other, and two of the three coupling surfaces are connected to the first header tank 210 and the second header tank 220, respectively, and the other of the three coupling surfaces is connected to the external housing 50.

Therefore, the fixing bracket 400 fixes the first header tank 210 and the second header tank 220 to predetermined positions, thereby making it possible to assist the tube 100 to compress the electrical elements 2.

As described above, in the heat exchanger for cooling an electrical element according to the present invention, in the case in which the number of tubes 100 is two, it is preferable that the element fixing parts 21 of the electrical elements 2 are disposed in the internal space formed by the neighboring tubes 100 spaced apart, from each other in the width direction and the power supply parts 22 of the electrical elements 2 are disposed in the external spaces to facilitate connection of the power supply parts 22 at the time of assembling the entire module.

In this case, in the electrical element cooling module 10 according to the present invention, two upper plates 40 are disposed at positions corresponding to the tubes 100, and element coupling parts 42 coupled to the element fixing parts 21 may be formed at sides of the upper plates 40 neighboring to each other.

The upper plates 40 may include second plate coupling parts 41 formed at positions corresponding to first plate coupling parts 31 formed at both sides of the lower plate 30 in the width direction and coupled to the first plate coupling parts 31.

A process of assembling the electrical element cooling module 10 according to the present invention will be described.

First, the heat exchanger 1 for cooling an electrical element may be assembled in a scheme in which the electrical elements 2 are inserted and fixed between the facing surfaces of the tubes 100 in a state in which the bent tubes 100 are bent to form an angle of approximately 5 to 10 degrees and a spaced internal is pressed to allow the upper surfaces of the electrical elements 2 and the tubes 100 to be compressed.

In this case, the upper plates 40 and the lower plate 30 disposed on the upper and lower surfaces of the heat exchanger 1 for cooling an electrical element assist in compression of the tubes 100 due to the coupling between the first plate coupling parts 31 and the second plate coupling parts 41.

In this case, the element coupling parts 42 of the upper plates 40 are coupled to the element fixing parts of the electrical elements 2, such that all of the electrical elements 2, the upper plates 40, and the lower plate 30, and the tubes 100 are directly or indirectly connected to each other, thereby making it possible to improve an assembly property of the module.

The present invention is not limited to the above-mentioned exemplary embodiments, but may be variously applied. In addition, the present invention may be variously modified by those skilled in the art to which the present invention pertains without departing from the gist of the present invention claimed in the claims.

DETAILED DESCRIPTION OF MAIN ELEMENTS

1: heat exchanger for cooling electrical element
2: electrical element
3: heat exchanger assembly for cooling electrical element
10: electrical element cooling module
21: element fixing part.
22: power supply part.
30: lower plate
31: first plate coupling part
40: upper plate
41: second plate coupling part
42: element coupling part
50: external housing
51: first coupling hole
52: second coupling hole
53: sealing member
60: elastic member
100: tube
101: first tube
102: second tube
101$h$: first tube insertion hole
102$h$: second tube insertion hole
110: round part
210: first header tank
220: second header tank
310: inlet pipe
320: outlet pipe
400: fixing bracket

The invention claimed is:

1. An electrical element cooling module comprising:
a tube extended in a length direction, bent at a predetermined point so as to contact both surfaces, in a height direction, of the electrical element disposed in a partial region of an upper surface thereof, and having a heat exchange medium flowing therein;
a first header tank coupled and fixed to one end portion of the tube in the length direction;
a second header tank coupled and fixed to the other end portion of the tube in the length direction and disposed to be spaced apart from a center of the first header tank by a predetermined distance in the length direction in a state in which the tube is bent;
an inlet pipe formed in the first header tank and having the heat exchange medium introduced therethrough;
an outlet pipe formed in the second header tank and having the heat exchange medium discharged therethrough;
a lower plate disposed on a lower surface of the heat exchanger for cooling the electrical element;
an upper plate disposed on an upper surface of the heat exchanger for cooling the electrical element and coupled to the lower plate to apply a predetermined pressure to the heat exchanger for cooling the electrical element; and
an external housing in which the heat exchanger for cooling the electrical element, the lower plate, and the upper plate are accommodated.

2. The electrical element cooling module of claim 1, further comprising an elastic member disposed in a space between the upper plate and the tube and having elasticity in the height direction.

3. The electrical element cooling module of claim 2, wherein the elastic member is extended in the length direction so as to correspond to the tube, and is bent from both end portions in a zigzag form so that both sides thereof are symmetrical to each other on the basis of a central line in a width direction.

4. The electrical element cooling module of claim 1, wherein the electrical element cooling module is in communication with the outside of the external housing through the inlet pipe and the outlet pipe, and
a first coupling hole and a second coupling hole into which the inlet pipe and the outlet pipe are inserted to protrude outwardly are formed in the external housing.

5. The electrical element cooling module of claim 4, further comprising sealing members mounted between the inlet pipe and the first coupling hole and between the outlet pipe and the second coupling hole.

6. The electrical element cooling module of claim 4, further comprising a fixing bracket connecting the heat exchanger for cooling the electrical element and the external housing to each other.

7. The electrical element cooling module of claim 6, wherein the fixing bracket is coupled to one or more of the first header tank, the second header tank, the tube, the inlet pipe, and the outlet pipe.

8. The electrical element cooling module of claim 4, further comprising on additional tube wherein in the case in which the number of tubes of the heat exchanger for cooling the electrical element is two and wherein the two tubes are neighboring,
- wherein element fixing parts of the electrical element are disposed in an internal space formed by the neighboring two tubes spaced apart from each other in a width direction, and
- wherein power supply parts of the electrical element are disposed in an external space.

9. The electrical element cooling module of claim 8, wherein two upper plates are disposed at positions corresponding to the tubes, and
- element coupling parts coupled to the element fixing parts are formed at sides of the upper plates neighboring to each other.

10. The electrical element cooling module of claim 9, wherein the upper plates include second plate coupling parts formed at positions corresponding to first plate coupling parts formed at both sides of the lower plate in a width direction and coupled to the first plate coupling parts.

* * * * *